United States Patent [19]

Bencuya et al.

[11] Patent Number: 4,566,172
[45] Date of Patent: Jan. 28, 1986

[54] METHOD OF FABRICATING A STATIC INDUCTION TYPE RECESSED JUNCTION FIELD EFFECT TRANSISTOR

[75] Inventors: Izak Bencuya, Needham; Adrian I. Cogan, Waltham, both of Mass.

[73] Assignee: GTE Laboratories Incorporated, Waltham, Mass.

[21] Appl. No.: 583,512

[22] Filed: Feb. 24, 1984

[51] Int. Cl.[4] .......................................... H01L 21/425
[52] U.S. Cl. ........................................ 29/571; 29/578; 29/580; 29/576 B; 148/187
[58] Field of Search ............ 29/571, 578, 580, 576 B; 148/187

[56] References Cited

U.S. PATENT DOCUMENTS

| | | | |
|---|---|---|---|
| 3,828,230 | 8/1974 | Nishizawa et al. | 357/22 |
| 3,999,281 | 12/1976 | Goronkin et al. | 29/578 X |
| 4,115,793 | 9/1978 | Nishizawa | 357/22 |
| 4,199,771 | 4/1980 | Nishizawa et al. | 357/22 |
| 4,262,296 | 4/1981 | Shealy et al. | 357/22 X |
| 4,326,209 | 4/1982 | Nishizawa et al. | 357/22 |
| 4,375,124 | 3/1984 | Cogan | 29/580 X |
| 4,403,396 | 9/1983 | Stein | 29/571 |
| 4,476,622 | 10/1984 | Cogan | 148/187 X |
| 4,505,022 | 3/1985 | Briere | 29/578 X |
| 4,506,435 | 3/1985 | Pliskin et al. | 29/576 N |

FOREIGN PATENT DOCUMENTS 2026237  1/1980  United Kingdom .

OTHER PUBLICATIONS

Cogan et al., *International Electron Devices Meeting*, Wa., D.C., Dec. 6, 1983, Paper 9.5, pp. 221–224.

*Primary Examiner*—George T. Ozaki
*Attorney, Agent, or Firm*—David M. Keay

[57] ABSTRACT

Junction field effect transistor, specifically a static induction transistor and method of fabricating. A low resistivity N-type layer is formed at the surface of a high resistivity N-type epitaxial layer which has been grown on a low resistivity N-type substrate of silicon. The surface of the low resistivity N-type layer is coated with silicon nitride, portions of the silicon nitride are removed and the silicon is etched to form parallel grooves with interposed ridges of silicon. Silicon dioxide is grown in the grooves, removed from the end walls of the grooves, and P-type zones are formed at the end walls of the grooves. The depth of the grooves is increased by etching to remove most of the P-type zone underlying each groove while leaving laterally extending P-type portions. Oxygen is implanted to convert the remainder of the P-type zones underlying the end walls of the grooves to silicon dioxide. Metal layers are deposited in the bottoms of the grooves making contact with the P-type portions. The grooves are filled with filler material and materials are etched away to produce a flat, planar surface with low resistivity N-type silicon of the ridges exposed in the surface and with filler material in the grooves also exposed at the surface. A large area metal contact is applied which extends across the surface and makes ohmic contact to the low resistivity N-type silicon of all the ridges.

22 Claims, 8 Drawing Figures

METHOD OF FABRICATING A STATIC INDUCTION TYPE RECESSED JUNCTION FIELD EFFECT TRANSISTOR

CROSS-REFERENCE TO RELATED APPLICATION

This application is related to application Ser. No. 583,514 filed Feb. 24, 1984 herewith by Izak Bencuya and Adrian I. Cogan entitled "Junction Field Effect Transistor and Method of Fabrication" and assigned to the assignee of the present application.

BACKGROUND OF THE INVENTION

This invention relates to semiconductor devices. More particularly, it is concerned with junction field effect transistors of the static induction type and to methods of fabrication.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode. These devices are described by Nishizawa et al in U.S. Pat. No. 3,828,230 issued Aug. 6, 1974, and in U.S. Pat. No. 4,199,771 issued Apr. 22, 1980.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse bias is varied, the source-drain current and voltage derived from an attached energy source will also vary.

Recessed gate static induction transistors which have improved characteristics are described in United Kingdom Patent Application No. 2026237 which was published on Jan. 30, 1980, and in an article "High Performance Microwave Static Induction Transistors" by Cogan et al published in the proceedings of the International Electron Devices Meeting (IEEE) Dec. 5, 6, and 7, 1983, Washington, D.C., Paper 9.5, Page 221-224.

The design and fabrication of static induction transistors particularly those having recessed gate structure are difficult because of extremely tight dimensional tolerances. Alignment and registration of the masks employed in delineating the various regions of the device are critical. In addition the structural elements of the completed device such as the bonding pads may contribute to degrading the operating characteristics particularly at extremely high operating frequencies.

SUMMARY OF THE INVENTION

The method of fabricating a junction field effect transistor in accordance with the present invention provides an improved method of obtaining accurate alignment of the critical elements of field effect devices such as static induction transistors and provides a junction field effect transistor having improved operating characteristics, The method in accordance with the present invention comprises providing a body of semiconductor material which includes a first layer of semiconductor material of one conductivity type of relatively low resistivity, a second layer of semiconductor material of the one conductivity type of relatively high resistivity contiguous the first layer, and a third layer of semiconductor material of the one conductivity type of relatively low resistivity contiguous the second layer. The first layer has a surface at the surface of the body of semiconductor material. A layer of a first protective material is formed adherent to the surface of the body. A plurality of parallel grooves are formed through the layer of first protective material and into the body of semiconductor material. Interposed ridges of semiconductor material are thus provided between the parallel grooves. The grooves extend through the first layer of semiconductor material into the second layer of semiconductor material. Each of the grooves has side walls formed by the adjacent ridges and an end wall.

Next the body of semiconductor material is treated to convert semiconductor material except that at the surfaces of the ridges of semiconductor material, which are protected by the first protective material, to a second protective material thereby forming a layer of the second protective material at the side walls and at the end walls of the grooves. The layer of second protective material is removed from the end walls of the grooves to expose the underlying second layer of semiconductor material. Conductivity type imparting material of the opposite conductivity type is then introduced into the second layer of semiconductor material at the end walls of the grooves to convert zones of the second layer of semiconductor material to the opposite conductivity type. Each of the zones has portions extending laterally toward the laterally extending portions associated with adjacent grooves to produce channel regions of the one conductivity type of relatively high resistivity between portions associates with adjacent grooves. The width of each of the channel regions is less than the width of the semiconductor material of the ridges of semiconductor material.

Semiconductor material of the zones of opposite conductivity type is removed at the end walls of the grooves to form extensions of the grooves. Each of the extensions has side walls in the laterally extending portions of the zones and has an end wall. Regions of the zones exposed at the end walls of the extensions of the grooves are converted to the second protective material. The regions of the second protective material extend through the zones to underlying semiconductor material of the second layer of the one conductivity type, electrically isolating the laterally extending portions of each zone from each other.

Conductive material is then applied to the end walls and to the side walls of the extensions of the grooves to form first electrical connections in ohmic contact with the laterally extending portions of the zones of the opposite conductivity type. Semiconductor material of the one conductivity type of the first layer in the ridges is exposed and conductive material is applied thereto to form a second electrical connection in ohmic contact therewith.

A junction field effect transistor in accordance with the present invention comprises a body of semiconductor material having a plurality of parallel grooves therein which extend from one surface thereof. Ridges of semiconductor material lie interposed between the grooves. Each of the grooves has side walls formed by the adjacent ridges of semiconductor material and an end wall. Each of the ridges has a region of one conductivity type of relatively low resistivity at the surface. A layer of the one conductivity type of relatively low resistivity underlies the ridges and the end walls of the grooves and is spaced from the end walls of the grooves. A region of the one conductivity type of relatively high resistivity lies between the regions of the one conductivity type of relatively low resistivity in the ridges and the layer of the one conductivity type of relatively low resistivity. Portions of the opposite conductivity type are inset in the region of the one conductivity type of relatively high resistivity at the side walls adjacent to the end wall of each of the grooves. The portions are spaced from the regions of the one conductivity type of relatively low resistivity in the ridges. The portions extend laterally to produce channel regions of the one conductivity type of relatively high resistivity between portions associated with adjacent grooves. The width of each channel region is less than the width of the semiconductor material of the ridges. A region of protective material is inset in the semiconductor material at the end wall of each groove and lies interposed between the portions of the opposite conductivity type adjacent to the end wall. Each groove contains a layer of conductive material contiguous the region of protective material and in ohmic contact with the portions of the opposite conductivity type at the side walls. Conductive material is in ohmic contact with each of the regions of the one conductivity type of relatively low resistivity in the ridges at the surfaces thereof.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION OF THE INVENTION

In fabricating junction field effect transistors of the static induction type in accordance with the invention as illustrated in the figures a substrate of single crystal semiconductor material of one conductivity type is provided as a supporting structure. As is well-understood the substrate is usually a slice or wafer of relatively large surface area upon which many identical devices are fabricated simultaneously. However, for purposes of illustration the fabrication of only a portion of a single static induction transistor in a fragment of a slice will be shown and described. In the following description silicon is employed as the semiconductor material and the substrate is of relatively low resistivity N-type conductivity.

Figure 1:
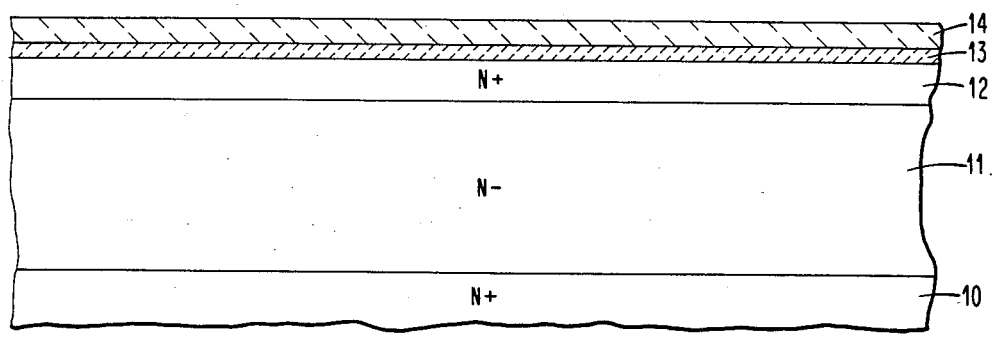
FIGS. 1 through 8 are a series of elevational views in cross-section of a fragment of a wafer of semiconductor material illustrating successive steps in the fabrication of a junction field effect transistor of the static induction type in accordance with the present invention.

A slice or wafer of N-type silicon of uniform relatively low resistivity having flat, planar, parallel opposed major surfaces, a fragment 10 of which is shown in FIG. 1, is produced by any of the known techniques of crystal fabrication including appropriate slicing and cleaning operations.

An epitaxial layer 11 of N-type silicon of uniform relatively high resistivity is grown on the surface of the substrate as by known vapor deposition techniques. A layer 11 which is precisely controlled as to thickness and as to resistivity and which is a continuation of the crystalline structure of the single crystal substrate 10 is thus deposited on the surface of the substrate. The upper surface of the epitaxial layer 11 is parallel to the interface between the substrate and the layer.

The wafer is treated in accordance with conventional techniques to implant N-type conductivity type imparting material, for example arsenic, into a layer at the surface of the epitaxial layer 11 to form a layer 12 heavily doped with the N-type conductivity type imparting material.

Next the surface of the wafer is covered with an adherent protective layer of silicon nitride 14. As is well-known in the art a thin buffer layer 13 of silicon dioxide is first formed on the surface of the wafer to reduce thermal mismatch effects.

Figure 2:
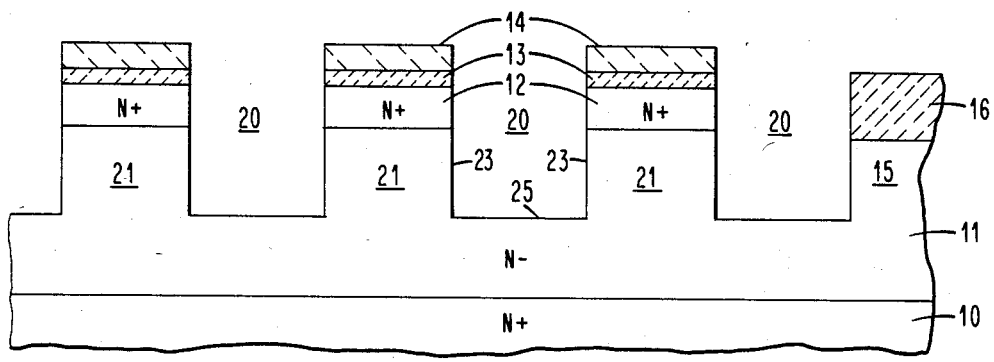

Then, as illustrated in FIG. 2, portions of the layer of silicon nitride 14 and underlying silicon dioxide 13 are removed by employing known photoresist masking and dry etching procedures to expose sections 15 of the silicon body in the field region which lies outside of the section which is the active device region to be utilized for fabricating a device structure. Silicon is removed from the exposed section by reactive ion etching to remove the exposed silicon of the heavily doped N-type upper layer 12. The wafer is then treated in the presence of oxygen at an elevated temperature to cause the exposed silicon to be converted to silicon dioxide and thus to grow a protective layer 16 in the sections 15 of the wafer outside the section in which the device is to be fabricated. The silicon dioxide layer 16 is grown to a thickness such that it is essentially co-planar with the surface of the wafer. The treatment at elevated temperature to form the protective silicon dioxide layer 16 causes the arsenic in the doped layer 12 to diffuse farther into the epitaxial layer 11.

Next, employing standard photoresist masking and etching techniques portions of the silicon nitride layer 14 and the silicon dioxide layer 13 in the active device region are removed to expose the silicon surface in a pattern of parallel areas. Exposed silicon is removed by employing known anisotropic etching techniques to form a plurality of parallel grooves or trenches 20 leaving interposed between the grooves 20 finger-like ridges 21 of silicon. Each of the grooves 20 has opposite side walls 23 formed by the two adjacent ridges 21 and also a bottom or end wall 25. FIG. 2 illustrates the wafer at this stage in the method.

Figure 3:
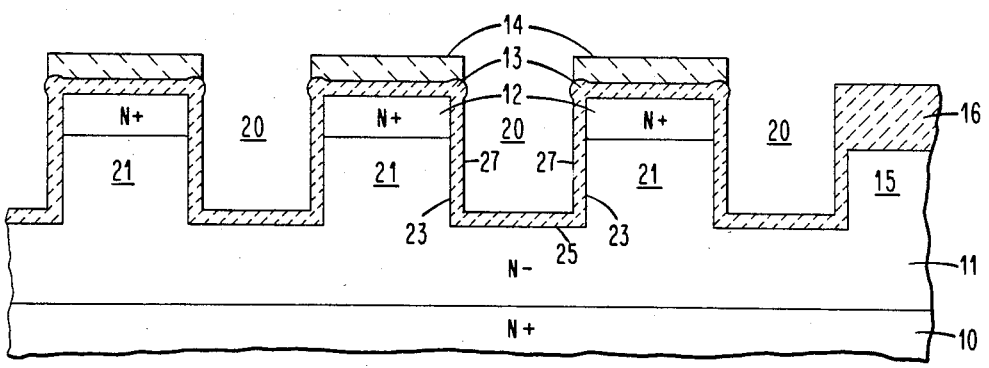

The wafer is then exposed to oxygen at an elevated temperature to grow silicon dioxide at all the exposed silicon surfaces. Thus, the side walls 23 and the end wall 25 of each of the grooves 20 become coated with an adherent silicon dioxide layer 27 as shown in FIG. 3. As is well-known the overlying silicon nitride layers 14 on the ridges 21 prevents further oxidization of the underlying silicon.

Figure 4:
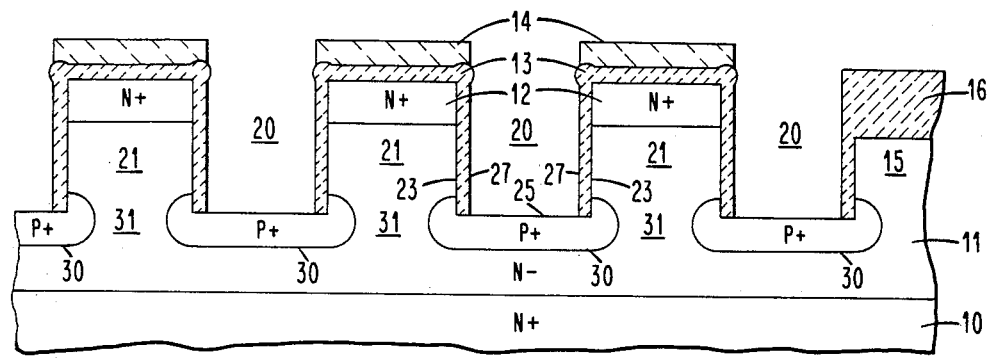

The wafer as illustrated in FIG. 3 is then subjected to etching in conventional reactive ion etching apparatus. As is well-understood the reactive ion etching procedure can be adjusted to remove all materials at a substantially equal rate in the vertical direction but does not remove material laterally. Thus, since the silicon dioxide layer 16 and the silicon nitride layer 14 are relatively thick, the thinner silicon dioxide of the layers 27 at the end walls of the grooves 20 is removed as illustrated in FIG. 4. The adherent silicon dioxide layers 27 at the side walls 23 of the grooves 20 remain essentially intact.

P-type conductivity imparting material, for example boron, is then introduced into the silicon of relatively high resistivity of the epitaxial layer 11 at the exposed end walls 25 by conventional ion implantation techniques. The silicon dioxide layers 16 and 27 and the silicon nitride layer 14 protect the remainder of the silicon wafer. The wafer is heated to cause the implanted material to diffuse into the epitaxial layer 11 from the region of the end walls 25. The P-type conductivity imparting material diffuses laterally as well as vertically. Zones of P-type material 30 are thus produced inset in the high resistivity N-type material of the epitaxial layer 11 as illustrated in FIG. 4. The lateral extension portions of the P-type zones 30 at each of two adjacent grooves 20 produce a narrowed channel region 31 of high resistivity N-type material between them. The channel region 31 is narrower than the width of the silicon across the ridge of silicon 21. FIG. 4 illustrates the wafer at this stage of the process.

Figure 5:
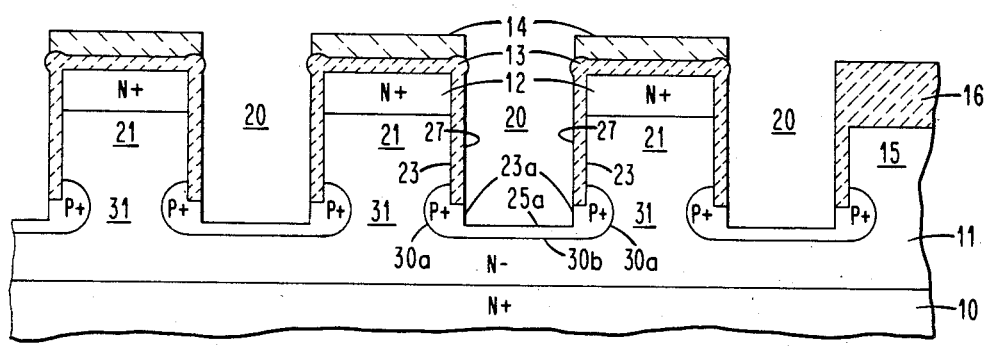
Figure 6:
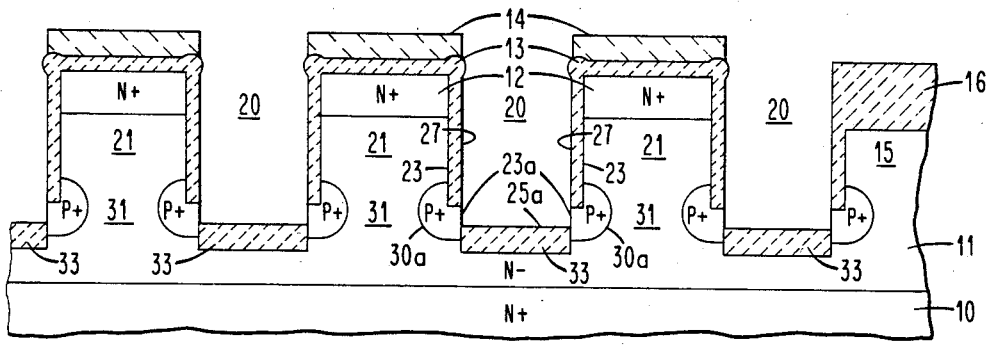

The wafer is treated in reactive ion etching apparatus to deepen the grooves 20 by removing material of the P-type zones 30 at the end walls of the grooves as illustrated in FIG. 5. The laterally extending portions 30a of the zone 30 remain and have surfaces providing side walls 23a of the extensions of the grooves. A thin layer 30b of the P-type zone may be left between the end wall 25a of the extension of each of the grooves and the high resistivity N-type material of the epitaxial layer 11. Ion implantation apparatus is employed to implant oxygen into regions 33 at the end walls 25a of the extensions of the grooves to convert the regions to silicon dioxide as illustrated in FIG. 6. The regions 33 of silicon dioxide extend through the remainder 30b of the P-type zones providing a region of insulation which electrically isolates the associated P-type portions 30a from each other. Two or three implantation procedures may be necessary in order to convert region 33 of sufficient thickness to silicon dioxide.

Figure 7:
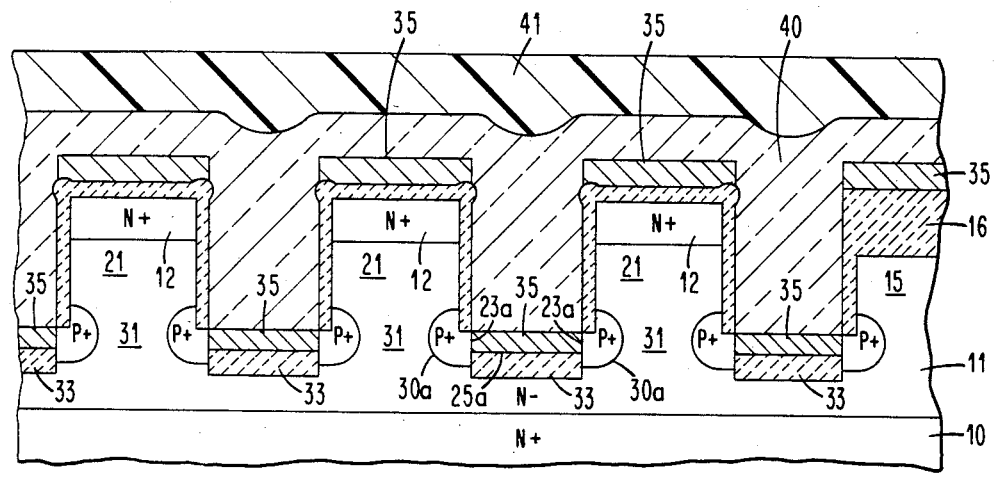

The wafer is then treated in a suitable etching material to remove the silicon nitride 14 overlying the ridges 21. Metal, specifically aluminum, is then deposited on the wafer. Because of the abrupt vertical step between the surfaces of the ridges 21 and the end walls 25 of the grooves 20, the metal separates so as to deposit metal 35 on the upper surfaces and also on the end walls 25a of the extensions of the grooves 20 overlying the silicon dioxide regions 33. The metal deposited in the grooves form a layer having its edges in ohmic contact with the P-type portions 30a at the side walls 23a of the extensions of the grooves. No metal is otherwise deposited on the side walls 23 of the grooves 20. The deposited metal 35 is shown in FIG. 7.

A fill material 40 is applied to fill the grooves 20 and to extend beyond the surfaces of the ridges. The fill material 40 is an inert, nonconductive material. Examples of material which may be employed are a low temperature chemically vapor deposited oxide or a spun-on polymide. Since the surface of the fill material 40 may not be sufficiently planar, a layer of photoresist 41 is applied over the filler material 40 so as to ensure a planar surface as illustrated in FIG. 7.

Figure 8:
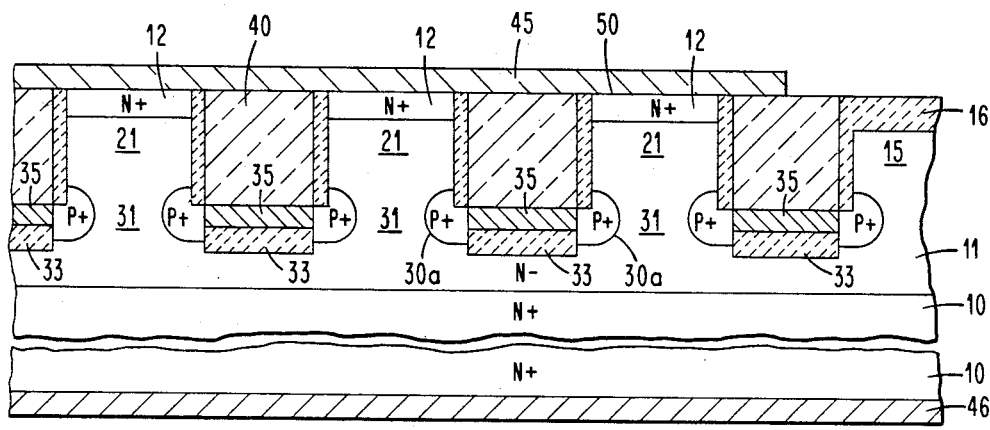

The wafer is then treated in reactive ion etching apparatus which, as mentioned hereinabove, can etch all the materials at essentially the same rate. Etching is carried out until the photoresist 41, the upper portion of the filler material 40, the metal deposits 35 over the ridges 21, and the silicon dioxide 13 on the surface of the ridges 21 are removed. As illustrated in FIG. 8 the wafer has a flat, planar, continuous surface 50. Each ridge 21 has a surface area of low resistivity N-type silicon of the layer 12 exposed at the surface 50. The upper surfaces of the fill material 40 within the grooves 20 and the upper surface of the remainder of the silicon dioxide layer 16 in the field region 15 lie in the upper surface 50.

A layer of metal, specifically aluminum, is then deposited on the surface 50 of the wafer. By employing suitable photoresist masking and etching techniques metal is removed so as to leave a metal contact member 45 which overlies the active area of the device. The contact 45 is in ohmic contact with the N-type regions 12 of the ridges 21 and is supported on the surface of the filler material 40 between the ridges. Also as is well-known in the art, the bottom surface of the substrate 10 may be appropriately metallized with a metal layer 46 to provide an ohmic contact to the low resistivity N-type silicon of the substrate 10.

The resulting junction field effect transistor (JFET) as illustrated by FIG. 8 includes source regions 12 of low resistivity N-type silicon in each of the ridges 21 and a drain region of low resistivity N-type silicon provided by the substrate 10. The channel region 31 of high resistivity N-type silicon between each source region 12 and drain region 10 lie between P-type portions 30a which form the gate regions. The gate contacts 35 are appropriately connected together and to a bonding pad (not shown) in a conventional manner. The metal layer 46 serves as the drain contact. The single large area source contact 45 is in good ohmic contact with all the source regions 12 and is of sufficient size to serve as the source bonding pad to which the source lead (not shown) is bonded directly.

In the fabrication of an exemplary static induction transistor structure in accordance with the present invention the substrate 10 may be a slice of single crystal N-type silicon doped with antimony to produce a uniform resistivity of 0.01 to 0.05 ohm-centimeters. The N-type epitaxial layer 11 of relatively high resistivity silicon is doped with arsenic during deposition to provide a uniform resistivity of about 15 ohm-centimeters. The epitaxial layer 11 may be about 12 micrometers thick. Arsenic is implanted by ion implantation to produce the relatively low resistivity N-type surface layer 12.

The grooves 20 are from 2 to 8 micrometers deep and from 2 to 6 micrometers wide. The interposed ridges 21 have a width of from 3 to 8 micrometers. The channel regions 31 between the gate regions 30 are from 0.5 to 4 micrometers wide.

The recessed gate geometry in static induction transistors provides increased gate-to-source separation, and the lateral extension of the gate region provide channel regions which are narrower than the widths of the source ridges. This structure provides low source-to-gate and source-to-drain capacitance and high voltage gain. The silicon dioxide regions interposed between the two portions of the P-type gates greatly reduces the size of the gate regions and consequently reduces the gate capacitance. The metal gate contacts along the bottoms of the grooves in contact with the P-type gate material along their entire length provides conductive paths of very low resistance. The process in accordance with the invention as described employs individually well-known techniques. The elements of the device are defined by self-alignment with existing structure or have relatively loose tolerances thus alleviating the necessity for precise alignment and registration of masks between processing steps.

Thus while there has been shown and described what is considered a preferred embodiment of the present invention, it will be obvious to those skilled in the art that various changes and modifications may be made therein without departing from the invention as defined by the appended claims.

What is claimed is:

1. The method of fabricating a junction field effect transistor comprising
    providing a body of semiconductor material including a first layer of semiconductor material of one conductivity type of relatively low resistivity, a second layer of semiconductor material of said one conductivity type of relatively high resistivity contiguous said first layer, and a third layer of semiconductor material of said one conductivity type of relatively low resistivity contiguous said second layer, said first layer having a surface at a surface of the body;
    forming a layer of a first protective material adherent to said surface;
    forming a plurality of parallel grooves through said layer of first protective material and into said body of semiconductor material providing interposed ridges of semiconductor material, said grooves extending through said first layer of semiconductor material into said second layer of semiconductor material, each of said grooves having side walls formed by the adjacent ridges of semiconductor material and an end wall;
    treating the body of semiconductor material to convert semiconductor material except at the surfaces of the ridges of semiconductor material protected by said first protective material to a second protective material thereby forming a layer of said second protective material at the side walls and end walls of said grooves;
    removing the layer of said second protective material from the end walls of said grooves to expose said second layer of semiconductor material;
    introducing conductivity type imparting material of the opposite conductivity type into said second layer of semiconductor material at the end walls of said grooves to convert zones of said second layer of semiconductor material to said opposite conductivity type, each of said zones having portions extending laterally toward the laterally extending portions associated with adjacent grooves to produce channel regions of the one conductivity type of relatively high resistivity between portions associated with adjacent grooves, the width of said channel regions being less than the width of the semiconductor material of said ridges of semiconductor material;
    removing semiconductor material of said zones of opposite conductivity at the end walls of said grooves to form extensions of said grooves, each of said extensions having side walls in said laterally extending portions of said zone and having an end wall;
    converting regions of said zones of semiconductor material exposed at the end walls of said extensions of said grooves to said second protective material, said regions extending through said zones to underlying semiconductor material of said second layer of the one conductivity type to electrically isolate the laterally extending portions of each zone from each other;
    applying conductive material to the end walls and to the side walls of the extensions of the grooves to form first electrical connections in ohmic contact with the laterally extending portions of the zones of the opposite conductivity type;
    exposing semiconductor material of the one conductivity type of said first layer in said ridges of semiconductor material; and
    applying conductive material to form a second electrical connection in ohmic contact with the semiconductor material of the one conductivity type of said first layer in said ridges of semiconductor material.

2. The method of fabricating a junction field effect transistor in accordance with claim 1 including subsequent to applying conductive material to the end walls and to the side walls of the extensions of the grooves the steps of
    applying filler material to fill said grooves and the extensions thereof and to extend beyond the surfaces of said ridges of semiconductor material to provide a surface parallel to the original surface of the body; and
    wherein exposing semiconductor material of the one conductivity type of said first layer in said ridges of semiconductor material includes
    removing materials from said surface of the filler material to a depth to expose semiconductor material of the one conductivity type of said first layer in said ridges of semiconductor material.

3. The method of fabricating a junction field effect transistor in accordance with claim 2 wherein
    applying filler material includes filling said grooves and the extensions thereof between said ridges of semiconductor material with an inert nonconductive filler material;
    removing materials from said surface of the filler material includes removing filler material to produce a flat planar surface having exposed surface areas of said first layer in said ridges of semiconductor material and surface areas of said inert nonconductive filler material in said grooves; and
    applying conductive material to form a second electrical connection includes forming a contact member of conductive material overlying said ridges and said grooves at said flat planar surface and making ohmic contact with the semiconductor material of the one conductivity type of said first layer in said ridges of semiconductor material.

4. The method of fabricating a junction field effect transistor in accordance with claim 3 wherein
    removing materials from said surface of the filler material includes reactive ion etching materials from the surface of the filler material to a depth to expose semiconductor material of the one conductivity type of relatively low resistivity in said ridges of semiconductor material.

5. The method of fabricating a junction field effect transistor in accordance with claim 4 wherein
removing the layer of said second protective material from the end walls of said grooves includes reactive ion etching materials from the surfaces parallel to the surfaces of said ridges of semiconductor material without etching the layers of said second protective material at the side walls of said grooves.

6. The method of fabricating a junction field effect transistor in accordance with claim 5 wherein
removing semiconductor material of said zones includes reactive ion etching materials from the surfaces parallel to the surfaces of said ridges of semiconductor material without etching the layer of said second protective material at the side walls of said grooves or the portion of the zones at the side walls of the extensions of said grooves.

7. The method of fabricating a junction field effect transistor in accordance with claim 6 wherein
introducing conductivity type imparting material of the opposite conductivity type into said second layer of semiconductor material at the end walls of said grooves includes
ion implanting conductivity type imparting material of the opposite conductivity type into semiconductor material of the one conductivity type of relatively high resistivity at the end walls of said grooves, and
heating to diffuse the ion implanted conductivity type imparting material of the opposite conductivity type into said zones of the semiconductor material.

8. The method of fabricating a junction field effect transistor in accordance with claim 7 wherein
the semiconductor material is silicon; the first protective material is silicon nitride; and the second protective material is silicon dioxide.

9. The method of fabricating a junction field effect transistor in accordance with claim 8 wherein
treating the body of semiconductor material to convert semiconductor material except at the surface of the ridges of semiconductor material protected by said first protective material to a second protective material includes exposing the body of silicon to oxygen at an elevated temperature to grow silicon dioxide at the surfaces thereof except at the surface areas underlying silicon nitride.

10. The method of fabricating a junction field effect transistor in accordance with claim 9 wherein
converting regions of said zones of semiconductor material exposed at the end walls of said extension of said grooves includes ion implanting oxygen into the silicon of said region to form silicon dioxide insulating regions.

11. The method of fabricating a junction field effect transistor comprising
providing a substrate of semiconductor material of one conductivity type of relatively low resistivity having a flat planar surface;
growing an epitaxial layer of semiconductor material of the one conductivity type of relatively high resistivity on said surface of the substrate, said epitaxial layer having a flat planar surface parallel to the interface of the epitaxial layer and the substrate, said epitaxial layer and said substrate forming a body of semiconductor material;
introducing conductivity type imparting material of the one conductivity type into said epitaxial layer from said surface to form a layer of semiconductor material of the one conductivity type of relatively low resistivity in said epitaxial layer adjacent to said surface;
forming a layer of a first protective material on the surface of the body;
removing portions of said layer of first protective material to expose a plurality of parallel areas of said surface;
removing semiconductor material at the exposed areas to form a plurality of grooves in said body of semiconductor material providing interposed ridges of semiconductor material, said grooves extending through said layer of semiconductor material of the one conductivity type of relatively low resistivity into the underlying layer of the one conductivity type of relatively high resistivity, each of said grooves having side walls formed by the adjacent ridges of semiconductor material and an end wall;
treating the body of semiconductor material to convert semiconductor material except at the surfaces of the ridges of semiconductor material protected by said first protective material to a second protective material thereby forming a layer of said second protective material at the side walls and end walls of said grooves;
removing the layer of said second protective material from the end walls of said grooves to expose the underlying semiconductor material of the one conductivity type of relatively high resistivity while leaving the layers of said second protective material at the side walls of the grooves;
introducing conductivity type imparting material of the opposite conductivity type into the exposed semiconductor material at the end walls of said grooves to convert zones of said semiconductor material of the one conductivity type of relatively high resistivity to said opposite conductivity type, each of said zones having portions extending laterally toward the laterally extending portions associated with adjacent grooves to produce channel regions of the one conductivity type of relatively high resistivity between portions associated with adjacent grooves, the width of said channel regions being less than the width of the semiconductor material of said ridges of semiconductor material;
removing semiconductor material of said zones of opposite conductivity type at the end walls of said grooves to form extensions of said grooves, each of said extensions having side walls in said laterally extending portions of said zone and having an end wall;
converting regions of said zones of semiconductor material exposed at the end walls of said extensions of said grooves to said second protective material, said regions extending through said zones to underlying semiconductor material of the one conductivity type of relatively high resistivity to electrically isolate the laterally extending portions of each zone from each other;
applying conductive material to the end walls and to the side walls of the extensions of the grooves to form first electrical connections in ohmic contact with the laterally extending portions of the zones of the opposite conductivity type;

exposing semiconductor material of the one conductivity type of relatively low resistivity in said ridges of semiconductor material; and applying conductive material to form a second electrical connection in ohmic contact with the semiconductor material of the one conductivity type of relatively low resistivity in said ridges of semiconductor material.

12. The method of fabricating a junction field effect transistor in accordance with claim 11 including subsequent to applying conductive material to the end walls and to the side walls of the extensions of the grooves the steps of filling said grooves and the extensions thereof with an inert nonconductive filler material extending beyond the surface of said ridges of semiconductor material; and applying filler material to provide a flat planar surface parallel to the surface of said ridges of semiconductor material; and wherein exposing semiconductor material of the one conductivity type of relatively low resistivity in said ridges of semiconductor material includes removing a uniform layer of materials from said surface of the filler material to a depth to expose semiconductor material of the one conductivity type of relatively low resistivity in said ridges of semiconductor material.

13. The method of fabricating a junction field effect transistor in accordance with claim 12 wherein removing a uniform layer of materials from said surface of the filler material includes removing materials to produce a flat planar surface having exposed surface areas of the one conductivity type of relatively low resistivity in said ridges of semiconductor material and surface areas of said inert nonconductive filler material in said grooves; and applying conductive material to form a second electrical connection includes forming a contact member of conductive material overlying said ridges and said grooves at said flat planar surface and making ohmic contact with the semiconductor material of the one conductivity type of relatively low resistivity in said ridges of semiconductor material.

14. The method of fabricating a junction field effect transistor in accordance with claim 13 wherein removing a uniform layer of materials from said surface of the filler material includes reactive ion etching materials from the surface of the filler material to a depth to expose semiconductor material of the one conductivity type of relatively low resistivity in said ridges of semiconductor material.

15. The method of fabricating a junction field effect transistor in accordance with claim 14 wherein removing the layer of said second protective material from the end walls of said grooves includes reactive ion etching materials from the surfaces parallel to the surfaces of said ridges of semiconductor material without etching the layers of said second protective material at the side walls of said grooves.

16. The method of fabricating a junction field effect transistor in accordance with claim 15 including removing semiconductor material of said zones includes reactive ion etching materials from the surfaces parallel to the surfaces of said ridges of semiconductor material without etching the layer of said second protective material at the side walls of said zones or the portions of the zones at the side walls of the extensions of said grooves.

17. The method of fabricating a junction field effect transistor in accordance with claim 16 wherein introducing conductivity type imparting material of the opposite conductivity type into the exposed semiconductor material at the end walls of said grooves includes ion implanting conductivity type imparting material of the opposite conductivity type into semiconductor material of the one conductivity type of relatively high resistivity at the end walls of said grooves, and heating to diffuse the ion implanted conductivity type imparting material of the opposite conductivity type into said zones of semiconductor material.

18. The method of fabricating a junction field effect transistor in accordance with claim 17 wherein the semiconductor material is silicon; the first protective material is silicon nitride; and the second protective material is silicon dioxide.

19. The method of fabricating a junction field effect transistor in accordance with claim 18 wherein treating the body of semiconductor material to convert semiconductor material except at the surfaces of the ridges of semiconductor material protected by said first protective material to a second protective material includes exposing the body of silicon to oxygen at an elevated temperature to grow silicon dioxide at the surfaces thereof except at the surface areas underlying silicon nitride.

20. The method of fabricating a junction field effect transistor in accordance with claim 19 wherein converting regions of said zones of semiconductor material exposed at the end walls of said extensions of said grooves includes ion implanting oxygen into the silicon of said regions to form silicon dioxide insulating regions.

21. The method of fabricating a junction field effect transistor in accordance with claim 20 including subsequent to forming a layer of silicon nitride on the surface of the body and prior to removing portions of the layer of silicon nitride to expose a plurality of parallel areas of said surface the steps of removing portions of the layer of silicon nitride to expose the surface of a section of the body of silicon adjacent to the section in which the plurality of grooves and interposed ridges of silicon nitride are to be formed;

etching the body of silicon at the exposed surface of the section to remove silicon of the one conductivity type of relatively low resistivity and expose the underlying silicon of the one conductivity type of relatively high resistivity; and growing a layer of silicon dioxide at the surface of the underlying silicon of the one conductivity type of relatively high resistivity to a thickness to provide a surface essentially planar with the surface of the layer of silicon nitride by exposing the body of silicon to oxygen at an elevated temperature to grow silicon dioxide at the surfaces thereof except at the surface areas underlying silicon nitride.

22. The method of fabricating a junction field effect transistor in accordance with claim 21 wherein the one conductivity type is N-type; and the opposite conductivity type is P-type.

* * * * *